(12) United States Patent
Savage et al.

(10) Patent No.: US 7,973,336 B2
(45) Date of Patent: Jul. 5, 2011

(54) RELEASED FREESTANDING STRAINED HETEROJUNCTION STRUCTURES

(75) Inventors: Donald E. Savage, Madison, WI (US); Michelle M. Roberts, Madison, WI (US); Max G. Lagally, Madison, WI (US)

(73) Assignee: Wisconsin Alumni Research Foundation, Madison, WI (US)

(*) Notice: Subject to any disclaimer, the term of this patent is extended or adjusted under 35 U.S.C. 154(b) by 484 days.

(21) Appl. No.: 11/745,719

(22) Filed: May 8, 2007

(65) Prior Publication Data
US 2008/0296615 A1    Dec. 4, 2008

Related U.S. Application Data

(63) Continuation of application No. 11/014,574, filed on Dec. 16, 2004, now Pat. No. 7,229,901.

(51) Int. Cl.
*H01L 29/165* (2006.01)

(52) U.S. Cl. .......... 257/190; 257/E29.085; 438/479; 438/483

(58) Field of Classification Search .......... 257/190–194
See application file for complete search history.

(56) References Cited

U.S. PATENT DOCUMENTS

| | | |
|---|---|---|
| 4,846,931 A | 7/1989 | Gmitter et al. |
| 4,883,561 A | 11/1989 | Gmitter et al. |
| 5,073,230 A | 12/1991 | Maracas et al. |
| 5,344,517 A | 9/1994 | Houlding |
| 5,438,241 A | 8/1995 | Zavracky et al. |
| 5,461,243 A | 10/1995 | Ek et al. |
| 5,465,009 A | 11/1995 | Drabik et al. |
| 5,528,397 A | 6/1996 | Zavracky et al. |
| 5,759,898 A | 6/1998 | Ek et al. |
| 5,981,400 A | 11/1999 | Lo |
| 6,059,895 A | 5/2000 | Chu et al. |
| 6,214,733 B1 | 4/2001 | Sickmiller |
| 6,410,371 B1 | 6/2002 | Yu et al. |
| 6,515,751 B1 | 2/2003 | Craighead et al. |

(Continued)

FOREIGN PATENT DOCUMENTS

JP    2001217430 A  *  8/2001

OTHER PUBLICATIONS

U.S. Appl. No. 60/577,077, filed Feb. 23, 2006, Rogers et al.
U.S. Appl. No. 60/601,061, filed Feb. 23, 2006, Rogers et al.
U.S. Appl. No. 60/650,305, filed Feb. 23, 2006, Rogers et al.

(Continued)

*Primary Examiner* — Marcos D Pizarro
*Assistant Examiner* — Raj Gupta
(74) *Attorney, Agent, or Firm* — Bell & Manning, LLC (57) ABSTRACT

Growth of multilayer films is carried out in a manner which allows close control of the strain in the grown layers and complete release of the grown films to allow mounting of the released multilayer structures on selected substrates. A layer of material, such as silicon-germanium, is grown onto a template layer, such as silicon, of a substrate having a sacrificial layer on which the template layer is formed. The grown layer has a lattice mismatch with the template layer so that it is strained as deposited. A top layer of crystalline material, such as silicon, is grown on the alloy layer to form a multilayer structure with the grown layer and the template layer. The sacrificial layer is preferentially etched away to release the multilayer structure from the sacrificial layer, relaxing the grown layer and straining the crystalline layers interfaced with it.

22 Claims, 7 Drawing Sheets

U.S. PATENT DOCUMENTS

| | | | |
|---|---|---|---|
| 6,573,126 | B2 | 6/2003 | Cheng et al. |
| 6,602,613 | B1 | 8/2003 | Fitzgerald |
| 6,603,156 | B2 | 8/2003 | Rim |
| 6,690,043 | B1 * | 2/2004 | Usuda et al. ............ 257/194 |
| 6,703,144 | B2 | 3/2004 | Fitzgerald |
| 6,713,326 | B2 | 3/2004 | Cheng et al. |
| 6,816,301 | B1 | 11/2004 | Schiller |
| 6,878,611 | B2 | 4/2005 | Sadana et al. |
| 2002/0073779 | A1 | 6/2002 | Ito et al. |
| 2002/0096717 | A1 | 7/2002 | Chu et al. |
| 2002/0168864 | A1 | 11/2002 | Cheng et al. |
| 2003/0124815 | A1 | 7/2003 | Henley et al. |
| 2003/0168659 | A1 | 9/2003 | Lal et al. |
| 2004/0253792 | A1 | 12/2004 | Cohen et al. |
| 2005/0167698 | A1 * | 8/2005 | Hisaka ............ 257/194 |
| 2005/0189589 | A1 | 9/2005 | Zhu et al. |
| 2005/0205932 | A1 | 9/2005 | Cohen |
| 2006/0038182 | A1 | 2/2006 | Rogers et al. |

OTHER PUBLICATIONS

U.S. Appl. No. 60/663,391, filed Feb. 23, 2006, Rogers et al.
U.S. Appl. No. 60/677,617, filed Feb. 23, 2006, Rogers et al.
Supplementary European Search Report for EP App. No. 05849194 filed on Nov. 18, 2005, mailed on Nov. 23, 2009.
Drake, T.S., "Effect of rapid thermal annealing strain in ultrathin strained silicon", Applied Physics Letters, vol. 83, No. 5, Aug. 4, 2003.
Menard, E., "A printable form of silicon for high performance thin film transistors on plastic substrates", Applied Physics Letters, vol. 84, No. 26, Jun. 28, 2004.
Mooney, P.M., "Strained Si-on-Insulator Fabricated from Elastically-Relaxed Si/SiGe Structures", Mat. Res. Soc. Symp. Proc. vol. 809, 2004.
Mooney, P.M., "Elastic strain relaxation in free-standing SiGe/Si structures", Applied Physics Letters, vol. 84, No. 7, Feb. 16, 2004.

* cited by examiner

RELEASED FREESTANDING STRAINED HETEROJUNCTION STRUCTURES

CROSS-REFERENCE TO RELATED APPLICATIONS

This application claims the benefit of U.S. patent application Ser. No. 11/014,574 filed Dec. 16, 2004, the disclosure of which is incorporated by reference in its entirety.

STATEMENT OF GOVERNMENT RIGHTS

This invention was made with United States government support awarded by the following agency: NSF 0079983. The United States government has certain rights in this invention.

FIELD OF THE INVENTION

This invention pertains generally to the field of semiconductor processing and particularly to the formation of strained heterojunction semiconductor structures.

BACKGROUND OF THE INVENTION

Controlling the strain and the number and type of defects in heteroepitaxial semiconductor structures is crucial for obtaining high-quality semiconductor materials with the desired properties for forming high-performance devices. In the silicon/silicon-germanium hetero-system, appropriate control of the strain in the semiconductor layers provides control over band offsets and carrier mobility. Typically, it is desirable to be able to obtain a strain-relaxed SiGe virtual substrate on which a thin strained Si film is formed. The main obstacle to obtaining high-quality strained silicon is initially in obtaining a perfect strain-relaxed SiGe film. The typical approach for relaxing a SiGe film is to grow thick strain-graded SiGe on bulk silicon substrates. In such structures, relaxation occurs by the movement of dislocations through the SiGe film. Misfit dislocations at the interfaces between the layers relax the strain in the strained layers. The difficulty with dislocation-driven relaxation is that every misfit dislocation has two threading arms associated with the dislocation. The threading arms extend through the entire film system, including the strained-Si layer, degrading the carrier mobility. The density of dislocations in a carefully engineering graded SiGe substrate is low enough to create strained-Si devices, but it would nonetheless be preferable to be able to provide a SiGe substrate with no or very few dislocations. A further limitation with the use of graded SiGe substrates is that to achieve few dislocations in the Si layer, it is necessary to grow very thick graded SiGe films. However, the relatively thick films make it difficult to have adjacent devices that are in different strain states. Another consequence of growing a relaxed buffer layer is that the relaxation process generates steps through the opening of dislocation loops on the surface. These steps have a tendency to bunch together, creating a rough growth front. A polishing and cleaning step must be carried out before growing the silicon layer, adding cost to the processing. Thermal conductivity is also poor through the graded layers.

In one approach to overcoming the limitations of dislocation-based relaxation, compliant substrates have been proposed as a way to achieve strain control with no dislocations. A compliant substrate is composed of a very thin strained-layer system supported by a thick rigid substrate. The strained system is intended to distribute the strain based on thicknesses of the different layers by sliding on a compliant substrate. In a compliant system, all of the layers would have the same in-plane lattice constant but would be in different strain states. The problem with the compliant-substrate approach is that it is very difficult to achieve a truly compliant substrate, since doing so requires a large-scale slipping between the strained system and the compliant layer.

Another approach to obtaining the effect of a highly compliant substrate is to form patterned mesas that are undercut to leave each mesa supported by a center pedestal. The mesas can then act as free-standing substrates for SiGe growth. P. N. Mooney, et al. "Elastic Strain Relaxation in Free-Standing SiGe Structures," Applied Physics Letters, Vol. 84, No. 7, 16 February 2004, pp. 1093-1095. The supported mesas formed in this manner are fixed in location and are limited in the surface area available for device formation.

SUMMARY OF THE INVENTION

In accordance with the present invention, growth of multilayer films is carried out in a manner which allows close control of the strain in the grown layers and complete release of the grown films to allow mounting of the released multilayer structure on selected substrates. The released multilayer structures can be formed as discrete individual sections that can be placed at desired locations on a permanent substrate, or the structure can be released as a large, flexible film that can be mounted over a large-area substrate, including substrates with non-planar surfaces. The invention enables fabrication of electronic devices with improved characteristics, taking advantage of heterojunctions in which one or both of the adjacent layers is strained to significantly increase carrier mobility. Examples of devices that may be formed utilizing the invention include high-mobility modulation-doped field-effect transistors, wherein a strained silicon layer is utilized as a carrier channel clad with a silicon-germanium alloy in which the final strain state is achieved by elastic strain sharing between the films, and imaging and computing devices having higher speeds due to increased carrier mobility.

In a method of forming a strained crystalline layer in accordance with the invention, a layer of material such as a semiconductor is grown on a side of a crystalline template layer to form a multilayer structure, the template layer supported on its other side by a sacrificial layer of a substrate, the grown layer and the template layer having a lattice mismatch so that the grown layer is strained as it is formed. A top layer of crystalline material may be formed on the grown layer to form part of a multilayer structure with the grown layer and the template layer. The material adjacent to one of the sides of the sacrificial layer is then lithographically patterned and etched to expose areas of the sacrificial layer. The sacrificial layer is then preferentially etched at the exposed areas thereof to release the multilayer structure, with the result that the strain in the grown layer (and any top crystalline layer) is relaxed and the crystalline template layer is strained as the grown layer relaxes.

As an example of the invention, a layer of silicon-germanium of a selected silicon-to-germanium ratio is grown on the silicon template layer of a silicon-on-insulator (SOI) substrate. The SOI substrate includes a crystalline-silicon handle layer, a thin layer of silicon dioxide ($SiO_2$) insulator on the handle layer, and a top template layer of crystalline silicon formed on the top side of the silicon dioxide layer. The silicon-germanium layer will be compressively strained as it is grown because germanium has a larger lattice constant than silicon. A layer of initially unstrained silicon may then be formed on the silicon-germanium layer. An additional layer of silicon-germanium, which will again be compressively strained, may be grown on the top silicon layer. Further alternating layers of silicon and silicon-germanium, or other materials, may be deposited, if desired. The silicon dioxide sacrificial layer may then be preferentially etched to release the multilayer structure. To provide access to the sacrificial $SiO_2$ layer to allow etching, the material of the multilayer heterostructure above the $SiO_2$ sacrificial layer may then be patterned and etched down to the $SiO_2$ sacrificial layer utilizing lithographic patterning and etching. The patterning of the multilayer structure may be carried out to define isolated discrete islands of the multilayer structure or a continuous interconnected structure with openings, formed in a pattern, which extend through the multilayer structure to the $SiO_2$ sacrificial layer. Alternatively, the material of the handle layer may be lithographically patterned to form windows exposing the $SiO_2$ sacrificial layer that permit etching therethrough of the sacrificial layer. An etchant is applied that preferentially etches the $SiO_2$ sacrificial layer (and does not substantially etch the materials of the other layers exposed to the etchant) to release the multilayer structure from the handle layer, partially relaxing the compressively strained silicon-germanium bottom layer (and any additional silicon germanium layers) and straining the silicon template layer (and any additional silicon layers) interfaced with it. The released multilayer structure may then be transported and mounted on the surface of a selected substrate, such as crystalline silicon, silicon dioxide, sapphire, GaN, etc., and subsequently processed to form devices in the strained layer. Etching of the silicon dioxide insulating layer may be carried out using a liquid etchant, such as hydrofluoric acid (HF), or a vapor-based etchant, such as HF in vapor phase.

In addition to silicon-on-insulator, for the SiGe film system other substrates which provide a buried sacrificial layer can be utilized, such as strained silicon-on-insulator, silicon-on-sapphire, silicon with a highly doped intermediate layer or an implanted layer, silicon/germanium-on-insulator, germanium-on-insulator, etc. The invention may also be utilized with other semiconductors in addition to silicon and silicon-germanium (e.g., various III-V semiconductors), and with other materials for which substrates with the desired strain state and sufficient freedom from defects are not available commercially, such as various ferroelectric materials, magnetic metals, and oxides, utilizing appropriate sacrificial layers and etchants.

The process may be repeated to add additional layers of materials, e.g., silicon-germanium and silicon, etc., to achieve levels of strain in the final film greater than the strain levels that are obtained in a single stage of the process.

Further objects, features and advantages of the invention will be apparent from the following detailed description when taken in conjunction with the accompanying drawings.

DETAILED DESCRIPTION OF THE INVENTION

The present invention provides a new approach for controlling strain in heterostructures. For purposes of exemplifying the invention, the following describes the production of silicon/silicon-germanium heterostructures which are formed on silicon-on-insulator (SOI) substrates and then released, but the invention may be implemented in any semiconductor system or other material system requiring strain control as discussed herein.

Figure 1:
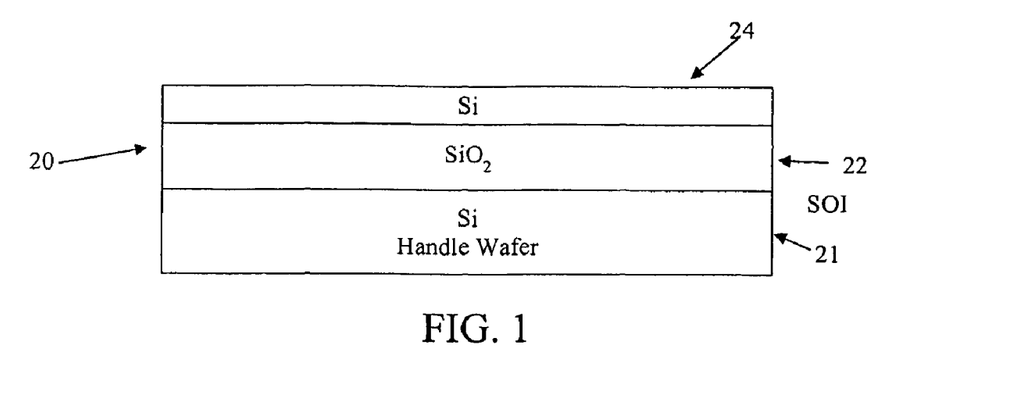
FIG. 1 is a simplified cross-sectional view of a silicon-on-insulator (SOI) wafer for use in the present invention.
Figure 2:
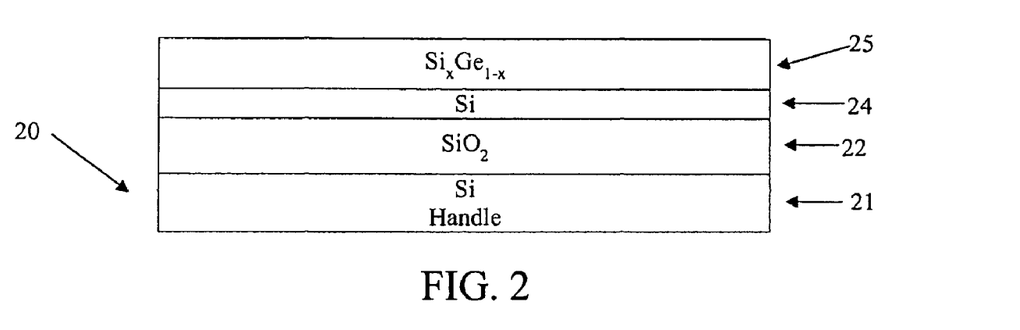
FIG. 2 is a view of the wafer as in FIG. 1 with the addition of a SiGe layer.
Figure 3:
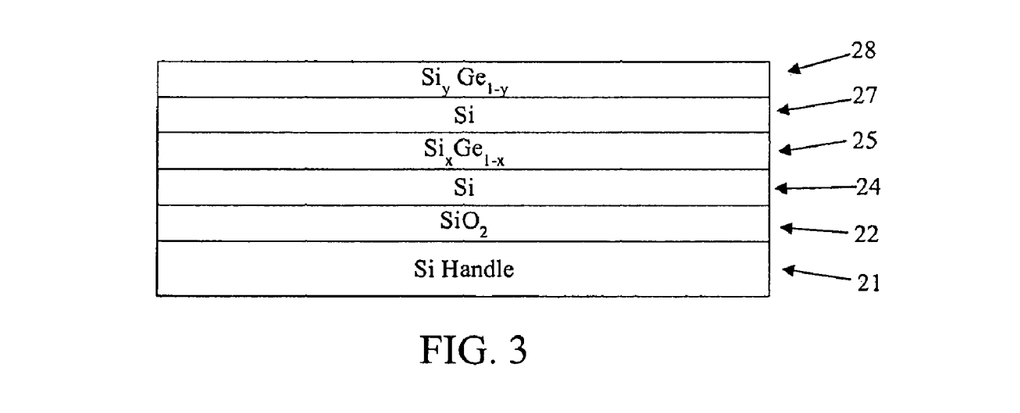
FIG. 3 is a view as in FIG. 2 after formation of the top Si layer on the SiGe layer to form a multilayer structure, with an optional SiGe top layer being shown.
Figure 4:
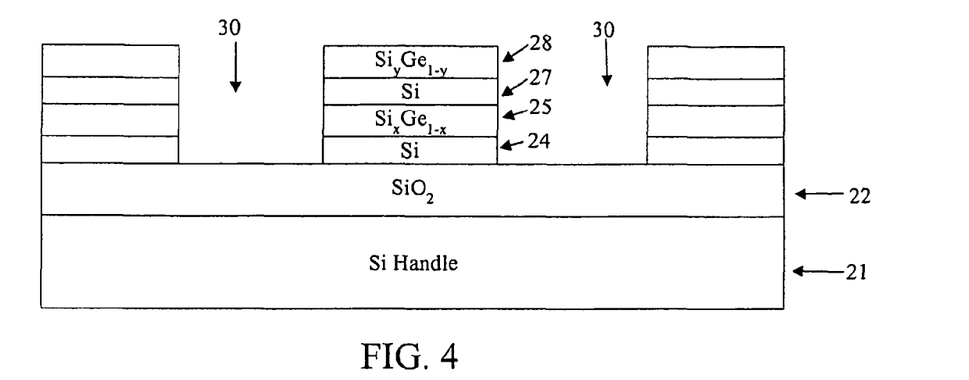
FIG. 4 is a view of the wafer of FIG. 3 after patterning and etching of the multilayer structure to the $SiO_2$ sacrificial layer.
Figure 5:
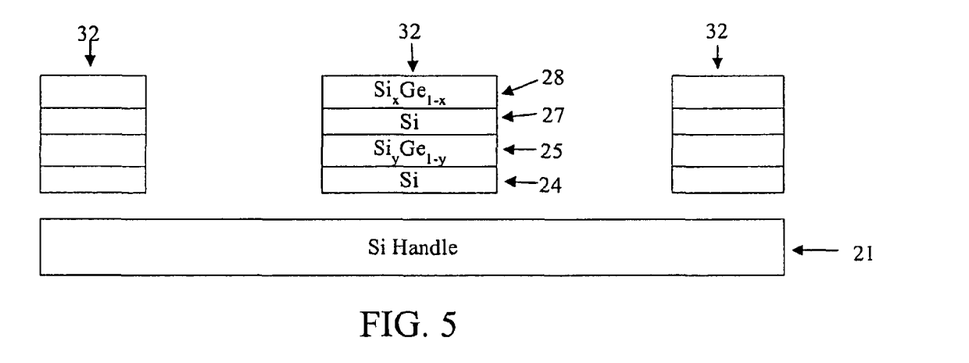
FIG. 5 is a view of the wafer of FIG. 4 after etching of the $SiO_2$ sacrificial layer to release the multilayer structure.

An initial SOI wafer is shown generally in cross-section at 20 in FIG. 1 and includes a crystalline silicon handle wafer 21, an insulating (sacrificial) layer 22 of $SiO_2$, and a template layer 24 of crystalline silicon that is typically 10 to 100 nm thick. As shown in FIG. 2, an initial layer 25 of SiGe is grown epitaxially on the silicon template layer 24 by any suitable process, such as molecular beam epitaxy (MBE), chemical vapor deposition (CVD), sputter deposition, etc., with the SiGe layer 25 in a state of internal compressive strain as grown because of the lattice mismatch with the silicon template layer 24. A further layer of crystalline silicon 27 may be grown on the SiGe layer 25 and an optional top layer 28 of SiGe may then be grown on the top silicon layer 27, as illustrated FIG. 3. As indicated in the figures, the composition of the two silicon-germanium layers 25 and 28 need not be the same. For example, the germanium content of the second SiGe layer 28 may be higher than that of the first SiGe layer 25. The multilayer structure comprising the layers 24, 25, preferably 27 (and optionally 28, as well as optional additional layers), is then lithographically patterned and etched at areas 30 that expose the $SiO_2$ insulating layer 22 as illustrated in FIG. 4. An etchant, which preferentially etches $SiO_2$, is then applied via the exposed areas 30 to etch away the $SiO_2$ layer (functioning as a sacrificial layer) under the multilayer structure 32 and thereby free the multilayer structure 32 from the sacrificial layer 22 and handle layer 21, as shown in FIG. 5. When the multilayer structure is freed from the insulating layer 22, as the SiGe layer relaxes, strain is transferred to the silicon layers 24 and 27.

Figure 6:
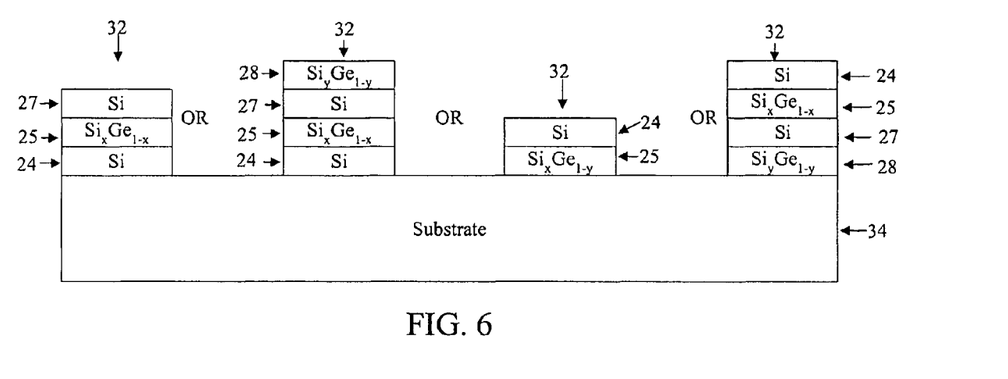
FIG. 6 is a cross-sectional view illustrating the multilayer structure of the invention after mounting onto a permanent substrate.

The free patterned multilayer structure 32 may then be transported to and mounted onto a permanent substrate 34 as illustrated in FIG. 6. Various permanent substrates may be utilized, including the original silicon handle layer 21 and various other types of substrates, examples only of which include glass, hydrogen terminated silicon, silicon with a thermal oxide, sapphire, GaN, plastics and grids. The freed structures 32 may be applied to an appropriate substrate before further processing to form devices in the strained silicon layer 27 or in other layers of the multilayer structure. As indicated in FIG. 6, the multilayer structure 32 may be mounted on the substrate 34 so that the exposed layer in which devices may be formed is the silicon layer 27, the silicon template layer 24, or a strain relaxed SiGe layer (25 or 28). The freed structures may also be mounted to a handle wafer having a sacrificial layer, and the process described above repeated to add additional SiGe layers with higher Ge contents than previously deposited SiGe layers, with Si grown over the second (or third, etc.) SiGe layer at even greater strain levels.

Figure 7:
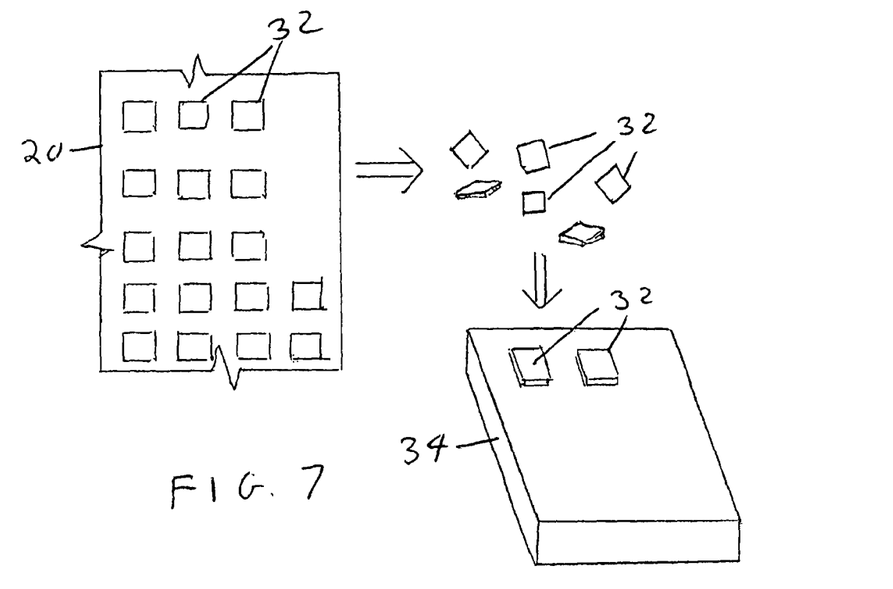
FIG. 7 is an illustrative view showing the release of discrete sections of the multilayer structure of the invention and the transport and mounting of the released structures to a permanent substrate.
Figure 8:
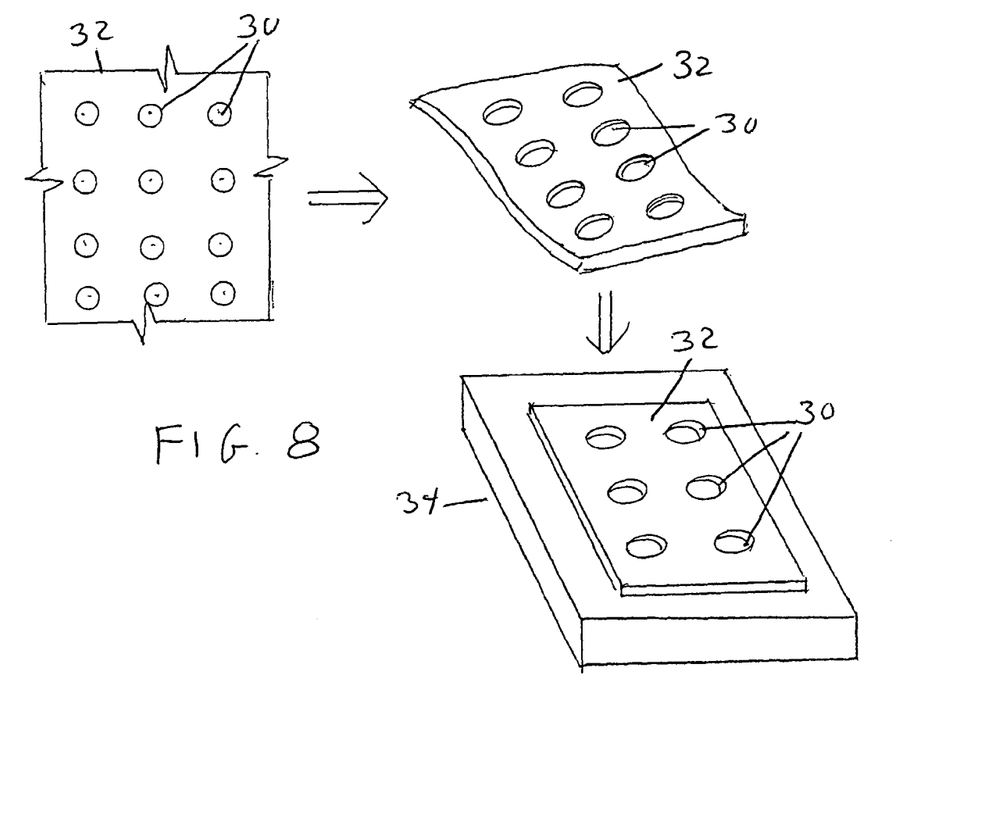
FIG. 8 is an illustrative view showing the release of a large-area film of the multilayer structure of the invention and the transport and mounting of the film onto a permanent substrate.

As illustrated in FIG. 7, the multilayer structures 32 may be formed as discrete islands of various shapes (e.g., squares, rectangles, circular disks, etc.) which are released to permit the individual structure sections 32 to be transported to and mounted upon the permanent substrate 34. Alternatively, as shown in FIG. 8, the multilayer structure 32 may be formed as a continuous film with separated openings 30 formed therein that is freed as a single large-area film. The flexible film 32 may then be applied to and mounted upon the surface of the permanent substrate 34.

The following examples illustrate specific implementations of the present invention, but it is understood that the invention is not to be limited to the particular materials and conditions set forth in the examples.

SOI with an ultra-thin Si template layer was prepared by thinning commercially obtained bonded SOI with a Si template layer 100 nm thick and an oxide layer thickness of 1.3 microns. To thin the SOI from the initial 100 nm template layer to a 20 nm template layer, a dry thermal oxidation of the Si template layer was performed at 1050° C. for 3.5 hours. The thermally grown oxide was then removed by an HF dip, leaving a 20 nm Si template layer. In the specific example below, an additional 80 nm of silicon was grown on the template layer from silane gas to provide a silicon layer thickness that was convenient for carrying out XRD measurements, but it is understood that such additional growth is not generally necessary.

$Si_{0.90}Ge_{0.10}$ films were grown epitaxially on the Si template of the SOI substrates by chemical vapor deposition in a cold-walled ultra-high vacuum CVD (UHV-CVD) reactor. A Si layer was then grown on the SiGe layer. The final film structure, at layer thicknesses suitable for x-ray diffraction measurements, consisted of 100 nm of Si on 200 nm of $Si_{0.90}Ge_{0.10}$ on 100 nm of Si. Growth temperature was controlled by resistively heating strips to 580° C. and calibrated by optical pyrometry on the backside. The reactor base pressure was $5\times10^{-10}$ Torr with 13 mTorr growth pressure.

Following growth, the samples were patterned using optical lithography, with the samples formed as mesh squares ranging in size from 7 mm×7 mm down to 0.1 mm×0.1 mm and with holes (corresponding to the openings 30) as small as 7 µm with a 14 µm pitch. The pitch of the holes 30 in the mesh is dependent on the desired HF etch time. A coarse pitch will require a longer etch time than a fine pitch.

After patterning, the mesh films were released using a chemical etch procedure. Before the release, the samples were cleaned with acetone and methanol to remove any remaining photoresist and then cleaned with a 10 second HF dip followed by a ten minute hydrogen peroxide and sulfuric acid piranha clean. After cleaning, the sample was placed in a 10% HF solution for 20 minutes. The sample was then carefully removed from the HF beaker and transferred to a Di (deionized) water beaker. When the sample was dropped into the water beaker, the mesh film was transferred to the surface of the water. The mesh film was then removed from the water surface by sliding it onto a new substrate. Films of this type can be transferred to glass slides, oxidized Si wafers, bulk hydrogen terminated Si wafers, and any type of grid, or any other desired substrate that is not soluble in water.

X-ray diffraction (XRD) reciprocal-space maps were made using a lab source x-ray diffractometer both before and after the release of the structure to determine the strain, thickness and composition of the multilayer system. For XRD measurements, the meshes were transferred to Si(001) substrates to determine the zero-strain position of the Si peak.

Following growth, (004) x-ray diffraction theta/two theta scans were performed while incrementing omega to obtain a map containing information on strain and orientation in the as-grown state. Immediately following growth, the system was coherent with the substrate. Theta/two theta line scans were fitted to determine composition and layer thickness.

Figure 9:
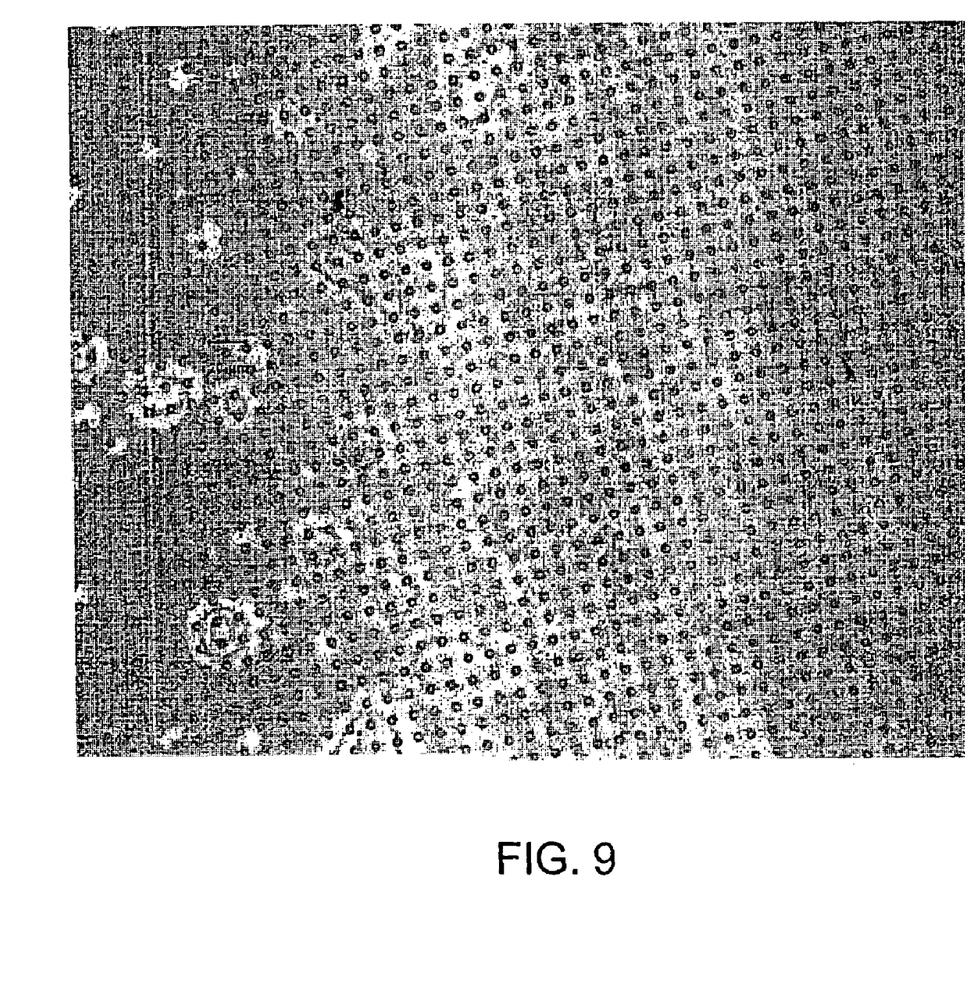
FIG. 9 is a view of the large-scale multilayer film of the invention after mounting of the film onto a permanent substrate.

A 2 mm×2 mm mesh film of a released Si/SiGe/Si structure with total Si thickness of 200 nm and total SiGe thickness of 200 nm was transferred to a Si substrate. An optical micrograph of the released mesh is shown in FIG. 9. The mesh was transferred to the new substrate with few visible wrinkles or cracks over the 2 mm×2 mm area of the film. The mesh membranes are very flexible, and can be adjusted on the new substrate until the water has evaporated. In addition to the large mesh membranes, rafts of 5-20 micron square pieces have been transferred to new substrates. Since the Si and SiGe thicknesses are equal and symmetric, a flat membrane is expected with the strain evenly divided between the Si and SiGe based on a compliant bi-layer model. However, it is not necessary that the film thicknesses be equal, and initially curved films may be flattened before further processing.

Figure 10:
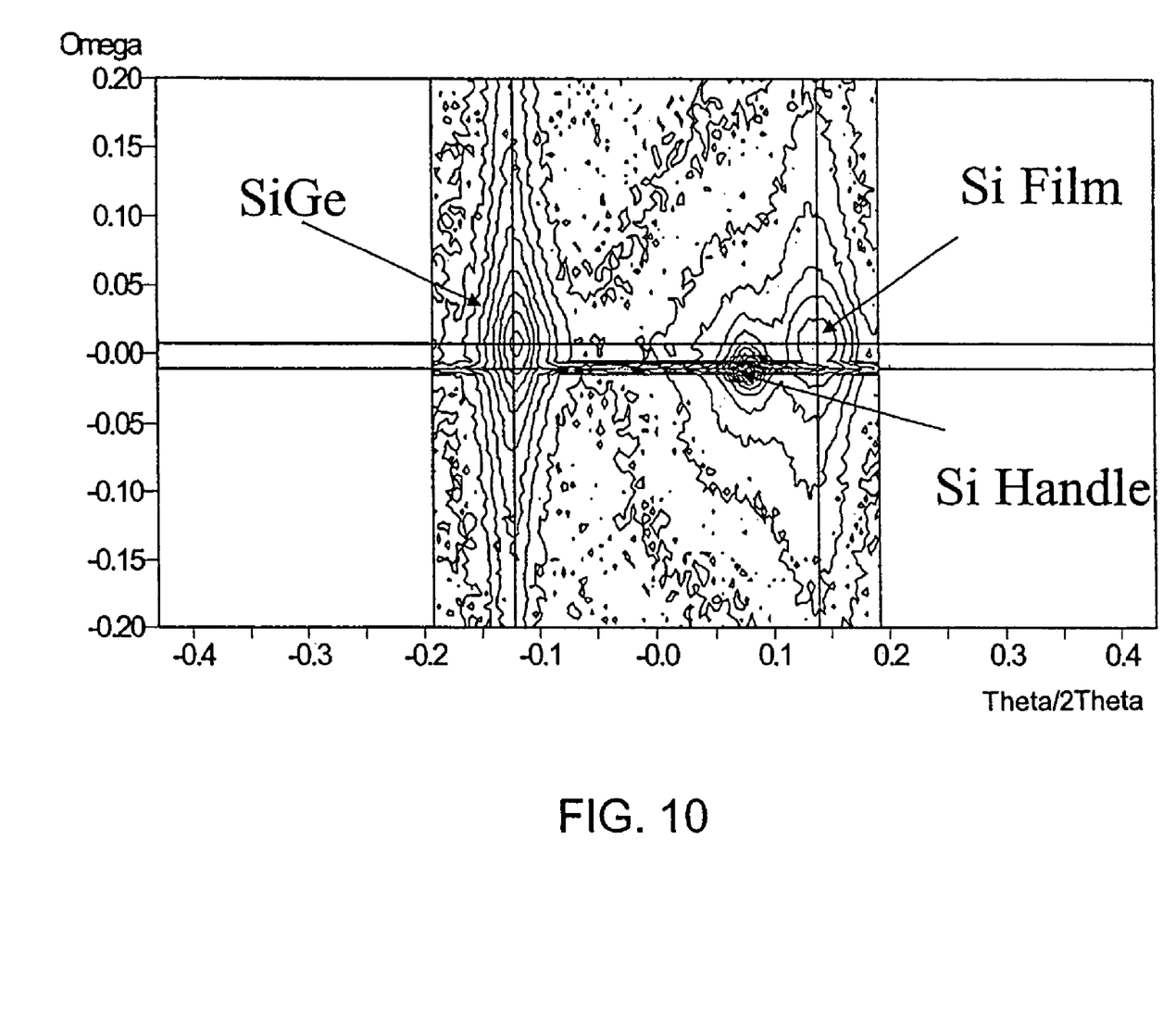
FIG. 10 is an x-ray diffraction (XRD) reciprocal-space map of the released Si/SiGe/Si multilayer structure after transfer and mounting to a Si substrate, with the separation in theta/2 theta (along the x-axis) between the Si film peak and the Si substrate handle layer peak describing the (tensile) strain in the Si film part of the structure, with the separation of the SiGe peak from the Si handle layer peak describing the (compressive) strain in the SiGe layer.

XRD reciprocal-space maps, as seen in FIG. 10, were measured on the mesh following release and transfer to a new Si substrate. The post release map shows partially relaxed SiGe, and partially strained Si, with the strain distribution matching that predicted by a compliant substrate. The separation in theta between the Si handle peak and the Si mesh peak in the theta/2 theta scan is 0.0630 degree and the separation in theta between the Si substrate (new handle) and the SiGe peak in the theta/2 theta scan is 0.200 degree. This compares to the predicted separation for a perfectly compliant bi-layer with 200 nm of Si and 200 nm of $Si_{0.90}Ge_{0.10}$ of 0.0560 degree Si handle to strained-Si separation and 0.200 degree Si handle to SiGe peak separation. In addition to showing that the Si layer has been strained, the XRD map shows that the diffraction peaks are sufficiently narrow to suggest only small mosaic tilts locally. The peaks' widths are actually narrower than those typically observed in strained Si grown on a graded SiGe substrate.

These examples show that strained SiGe films can be grown on unstrained SOI substrates and then successfully released from the Si handle wafer to achieve the desired strain state of the two materials. XRD measurements show that prior to release, the Si film is strain free and that the SiGe film is coherently strained to match the substrate. The size of the mesh films released was large enough to perform XRD on a single piece of released material using a lab x-ray source. Following release of the mesh, XRD measurements show that the Si is strained and the SiGe film is partially relaxed. The strain measured in the Si and SiGe layers is consistent with that predicted by a simple bi-layer model using the sum of the Si film thicknesses as one layer and the SiGe film thickness as the other.

The amount of strain that can be transferred to a thin Si layer by growing a strained SiGe film on a standard SOI substrate and then releasing the Si/SiGe system by removing the sacrificial layer depends on the cumulative Si layer thickness, the cumulative SiGe layer thickness, and the Ge composition in the SiGe layer.

To transfer the maximum strain to the Si, it is desirable to have the thinnest possible cumulative Si thickness that still produces a high-quality layer structure. The starting thickness of the Si template layer is typically around 20 nm. Initial Si template layer thicknesses of less than 20 nm result in a reduced film quality because of defects introduced to the film during the thinning process. It may be possible to reduce this thickness in the future as higher-quality commercially thinned SOI becomes available.

The other variables that control the amount of strain transferred to the Si are the thickness and Ge concentration in the SiGe layer. To maximize the transfer of strain to the Si, the SiGe thickness should be much thicker than the Si layer thickness, and higher Ge concentration will result in more strain in both layers for a given ratio of Si:SiGe thicknesses. The maximum SiGe thickness is limited by the onset of dislocation formation. If the critical thickness for the SiGe composition is exceeded, the structure will start to relax plastically, generating dislocations and reducing the strain available for transfer. Both the presence of dislocations and the strain reduction are a problem. The maximum Ge concentration is limited based on what Ge concentrations will give flat alloy growth. In practice, metastable SiGe films with a thickness up to 150 nm to 200 nm and a Ge concentration up to about 18% to 20% can be grown on unstrained Si without significant roughening or dislocation formation. A preferred, but not limiting, lower bound for the SiGe layer is about 5% Ge. Generally, it is preferred, but not limited thereto, that the Si layer thickness be less than about 200 nm and the SiGe layer be about at least 50 nm.

The ratio of Si:SiGe layer thicknesses and the Ge composition of the SiGe achievable for smooth growth with no dislocations puts an upper limit of about 0.56% on the amount of strain that can reasonably be expected to transfer to an initially unstrained film of Si. This amount of strain transfer is advantageous in enhancing electron mobility, but to enhance hole mobility, more strain in the Si is desirable. To increase the amount of strain in the Si, multiple growth and release steps can be used. Further, an SOI substrate having an initially tensile-strained silicon template layer (sSOI) may be utilized as the substrate. In this case, a higher Ge concentration can be utilized in the SiGe layer, e.g., in the 20%-35% Ge range, allowing even greater strain transfer to the silicon layers.

The following is an example of a procedure for the multiple growth and release step approach, although it is understood that the invention is not limited to the specific conditions and materials described for purposes of exemplifying the invention. A 150 nm SiGe film of, e.g., 18% Ge may be grown on a thinned SOI substrate with a Si template layer of 25 nm thickness and buried-oxide thickness of 1.3 micron, capped with 10 nm of Si grown using CVD. The Si/SiGe/Si structure is then patterned using optical lithography with a mesh pattern, and the structure is then plasma etched to open up holes in the film to expose the oxide for subsequent HF etching. The sample is released by etching the sacrificial buried oxide in a 10% HF solution and transferred to the surface of the water in the rinse beaker. The mesh film can then be transferred to a new clean Si wafer with a 1 micron oxide on the surface. The oxide layer acts as the sacrificial layer in the second release step. Additional SOI wafers are not necessary for multiple growth and release steps. A Si wafer with a thick oxide layer is of much lower cost than a thinned SOI wafer, and the absence of an additional Si layer reduces the total Si thickness, which increases the strain transferred to the Si layers. Following the release and transfer, the multilayer structure mounted on the oxidized Si wafer can be loaded back into the growth chamber and a new, higher-Ge-concentration, SiGe film can be deposited. Following this growth, the patterning, etching, and HF release of the membrane can be repeated. The strain in the Si layers will now be greater than before. The membrane can then be transferred to another oxidized Si wafer for additional growth and release steps to increase the strain in the Si layer, or transferred to the desired final substrate.

Released mesh films can be very advantageous for use in flexible-substrate applications. Currently, polysilicon films are grown directly on flexible materials for applications requiring flexible substrates. The speed of devices formed on polysilicon substrates is very low. The current state of flexible devices is such that being able to use single-crystal Si as the flexible substrate is a distinct improvement, so the need for the mobility enhancement provided by strained layers is currently unclear. Several methods of transferring unstrained released single-crystal Si pieces to flexible substrates are discussed in E Menard, K. J. Lee, D.-Y. Khang, R. G. Nuzzo, J. A. Rogers, "A printable form of silicon for high performance thin film transistors on plastic substrates." Appl. Phy. Lett., 84, 5398 (2004). This paper describes transferring Si from SOI onto flexible substrates. The approach is to pattern and chemically etch small structures on the SOI, and then release the structures by removing the buried oxide with HF. The focus is on long narrow strips that then are arranged on a flexible plastic substrate with gold pads.

Either HF vapor etching or HF liquid etching may be utilized in the release process. The two approaches both have advantages and disadvantages. Examples of the vapor and liquid etching processes are described below for purposes of illustration only, and it is understood that the invention is not limited to such processes or to the conditions described for exemplification.

In HF vapor etching, a sample is prepared for growth, for example, using a typical pre-growth clean consisting, e.g., of 10 minutes piranha, 10% HF for 10 seconds, 10 minutes piranha, 10% HF dip for 10 seconds, and 10 minutes piranha. A small amount of 49% HF is then put in a Teflon beaker. This beaker is covered with a lid containing many holes and the strip is placed face up over the holes. The system is then covered, allowing HF vapor to accumulate between the top cover and the strip. A lamp is positioned over the set-up to control the temperature of the sample by adjusting the distance between the sample and the lamp. The temperature of the sample controls the etch rate by controlling the amount of water condensed on the surface of the sample. A low temperature means more water condensation and a high etch rate. Etching at higher temperature reduces the water condensation on the oxide surface and decreases the etch rate.

There are both advantages and disadvantages to etching with HF vapor as opposed to etching in HF liquid. The primary advantage is in eliminating stiction. Stiction is a common problem in MEMS (micro-electro-mechanical systems) devices when undercutting and releasing devices. As the water evaporates from the sample, the capillary forces pull the device down to the substrate. If the released structure is etched while dry, the stiction caused by capillary forces can be eliminated.

The main disadvantage of vapor etching is the difficulty of controlling the etch process. The etch rate is very sensitive to small temperature changes, humidity changes, carbon contamination on the surface and other local changes. There may also be a residue left on the surface of the silicon at high etch rates. This requires that the etch rate and temperature be well controlled to result in a clean final structure.

It is generally only practical to routinely undercut structures a lateral distance on the order of 20-30 microns using vapor etching. It is possible to undercut farther, but commensurately longer etching times are required. Etching 20-30 microns laterally generally takes around an hour of vapor etching time. The area of a structure that can be released is limited to the extent that a large structure must have some amount of dead area. The dead area in the case of a mesh film, as shown in FIG. 9, consists of the small holes 30 etched in the Si template layer to allow the HF to penetrate to the oxide.

Releasing the structures by etching the oxide in HF liquid also has advantages and disadvantages. The primary advantage is that it is much easier to control the etching process. In the case of vapor etching, the liquid condensed on the surface determines the etch rate, but with liquid etching the rate is controlled by HF concentration. In addition, the HF liquid can be buffered with ammonium fluoride to keep the etch rate more consistent by keeping the pH low, as the HF is consumed by the etching process. Additionally, there is no residue left behind at high etch rates as the water is able to remove any excess reactants.

The main problem with HF liquid etching for devices that need to remain attached at some position to the substrate is encountered during the drying process. After removing the sample from the HF etch solution, it remains wet. As the water evaporates, capillary forces pull the released structure towards the Si substrate. Depending on the size of the released structure, the distance from the structure to the Si substrate, and the thickness of the released structure, the released structure may reach the Si substrate and stick. This phenomenon is called stiction and is a common problem in MEMs devices. To overcome the problems with stiction, MEMs are typically dried using critical-point drying. In critical-point drying, the released structure would be dried in a solvent at high temperature and pressure where the vapor and liquid particles are indistinguishable. However, critical-point drying requires solvents that can leave carbon contamination on the surface that may inhibit good subsequent growth.

Liquid etching is, however, advantageous for complete removal of membranes, as the water/HF solution acts as a barrier between the membrane and substrate. After release, the sample is removed from the HF solution and immediately dropped into a beaker of water. As the sample enters the water, the membrane is removed from the surface of the substrate by the water's surface tension. The membrane then floats on the surface of the water and can be transferred to a new substrate.

The foregoing examples illustrate patterning of the top multilayer structure in order to obtain access to the sacrificial oxide layer to allow etching of the sacrificial layer. Alternatively, etching through the handle layer can be utilized to gain access to the sacrificial layer to free the multilayer structure from the handle layer without patterning the multilayer structure. This may be carried out by etching an array of windows in the handle layer 21 down to the $SiO_2$ layer 22 utilizing an etchant which etches silicon and is stopped at the $SiO_2$ insulating layer. Because of the typical greater thickness of the handle layer 21, more etchant time may be required to etch through the handle layer to the sacrificial layer 22 than through the multilayer structure on top of the sacrificial layer.

Various processes can be utilized to etch through the handle layer 21 of the SOI wafer to obtain access to the sacrificial layer 21. An exemplary process is described below and illustrated with respect to FIGS. 11-17, although it is again noted that the invention is not limited to carrying out the processing in the manners set forth therein. Any process which allows access to the sacrificial layer to preferentially etch the sacrificial layer to release the multilayer structure may be utilized.

Figure 11:
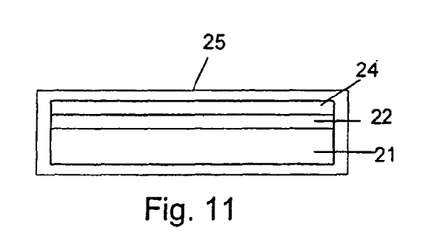
FIG. 11 is a simplified cross-sectional view of a SOI wafer with a SiGe layer grown thereon at an initial processing step in accordance with the present invention.
Figures 12, 13, 16, 17:
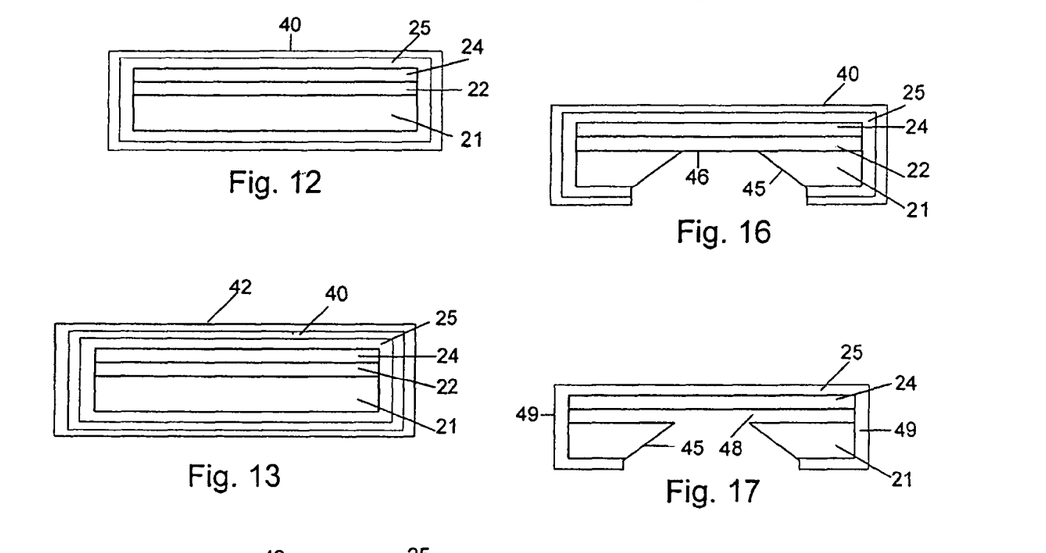
FIG. 12 is a view of the wafer as in FIG. 11 with the addition of an oxide layer over the SiGe layer.
FIG. 13 is a view as in FIG. 12 after formation of a SiN layer deposited over the oxide layer.
FIG. 16 is a view as in FIG. 15 after etching away the top SiN layer.
FIG. 17 is a view as in FIG. 16 after preferential etching of the $SiO_2$ insulating layer of the SOI wafer to free the top multilayer structure from the silicon handle layer.
Figure 14:
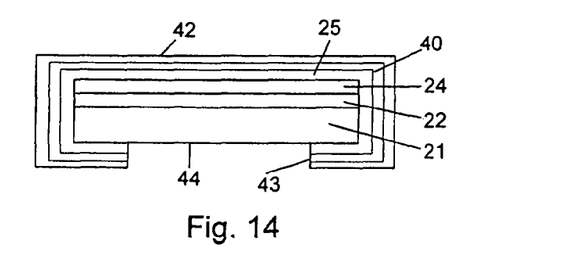
FIG. 14 is a view as in FIG. 13 after patterning and etching the layers deposited on the back side of the wafer.
Figure 15:
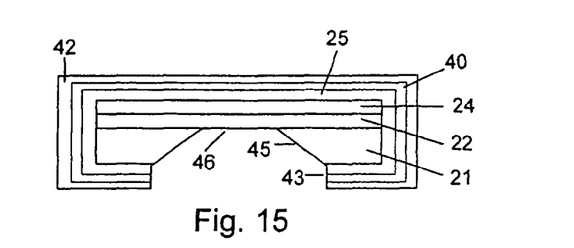
FIG. 15 is a view as in FIG. 14 after a preferential etch through the exposed silicon handle layer of the SOI wafer.

With reference to FIG. 11, the first step is the application of a layer 25 of SiGe grown, as discussed above, over the silicon layer 24 and also over all other surfaces of the SOI wafer, including the bottom surface of the handle layer 21 and the edges of the layers 21, 22, and 24. The layer 25 may be grown utilizing CVD, with the SOI wafer suspended in a manner which allows the film to be deposited on all surfaces of the wafer. A thermal $SiO_2$ layer 40 is then grown over all surfaces of the SiGe layer 25 to protect the surface of the SiGe layer during further processing as illustrated in FIG. 12. The oxide layer 40 may be grown, for example, to a thickness of 100 nm. A thin layer (e.g., 100 nm) of CVD grown silicon nitride ($Si_3N_4$) 42 is then grown over the $SiO_2$ layer 40 to protect the film system during chemical etching of the substrate, as shown in FIG. 13. One or more openings or windows 43 are then etched into the back side of the wafer through the layers 42, 40 and 25 to expose the back side of the handle layer 21 in an area 44, as illustrated in FIG. 14. Although one window 43 is illustrated, generally a pattern of windows is formed in the back side of the wafer to allow multiple access areas 44 to the handle layer 21. The patterning and development of a photoresist may be carried out using standard lithographic processing techniques. In the area not protected by a photoresist after the lithographic patterning, the silicon nitride layer 42 may be etched first, for example, by utilizing reactive ion etching (RIE), followed by an HF etch to remove the oxide layer 40, followed by RIE etching to remove the SiGe layer 25 (or layers). An etchant which preferentially etches Si as compared to $SiO_2$, such as KOH, may then be applied to the wafer to form an etch pit 45 which terminates at an area 46 exposing the $SiO_2$ layer 22, as illustrated in FIG. 15. The protective silicon nitride layer 42 may then be removed using, e.g., a wet phosphoric-acid etch, as illustrated in FIG. 16, and the entire wafer may then be exposed to an HF etch, as described above, to leave a void 48 under the silicon layer 24 to free the multilayer structure composed of the layers 24 and 25 from the handle layer 21, as illustrated in FIG. 17. The SiGe material connecting the multilayer structure 24 and 25 to the handle layer 21 at the edges 49 of the wafer generally are easily broken to allow release of the multilayer structure. Alternatively, the material at the edges 49 can be patterned to facilitate detachment. Also, the etched openings 45 in the handle layer 21 may be formed before the SiGe film 25 is deposited. The handle layer 21 may also be prepatterned and the multilayer structure then grown by MBE, which restricts growth to the top surface only.

It is also not essential that all of the layers illustrated in FIGS. 11-17 be epitaxially deposited. Materials may be grown on the template layer 24 or on additional layers above the template layer 24 which might have grains or defects, or which may even be amorphous, but which will still strain the crystalline layer 24 when it is released. Although it is generally not possible to grow additional crystalline layers on top of a non-crystalline layer, a strainer layer (e.g., a nitride) may be grown that adds additional strain to the multilayer membrane structure.

It is understood that the invention is not confined to the particular embodiments set forth herein as illustrative, but embraces all such forms thereof as come within the scope of the following claims.

What is claimed is:

1. A strained multilayer semiconductor structure comprising:
   (a) a bottom layer of tensilely strained crystalline silicon;
   (b) a layer of partially compressive strain-relaxed silicon-germanium alloy on the bottom silicon layer, the thickness of the layer of partially compressive strain-relaxed silicon-germanium alloy being below the thickness at which plastic relaxation generates dislocations in the structure; and
   (c) a top layer of tensilely strained crystalline silicon on the silicon-germanium layer, wherein the strain state of the multilayered semiconductor structure is achieved by elastic strain sharing between the layers, and further wherein the multilayer semiconductor structure is completely released from an underlying substrate upon which it was grown.

2. The semiconductor structure of claim 1 further including a layer of silicon-germanium on the top silicon layer.

3. The semiconductor structure of claim 1 wherein the silicon-germanium layer has a germanium content of about 5% to about 20%.

4. The semiconductor structure of claim 1 wherein the silicon-germanium layer has a germanium content of about 20% to about 35%.

5. The semiconductor structure of claim 1 wherein the silicon-germanium layer is free of dislocations and has a germanium content greater than 18%.

6. The semiconductor structure of claim 1 including a second partially compressive strain-relaxed silicon-germanium alloy layer on the top silicon layer and a second tensilely strained layer of silicon on the second silicon-germanium layer, wherein the germanium content of the second silicon-germanium layer is higher than that of the first silicon-germanium layer.

7. The semiconductor structure of claim 1 wherein the bottom layer of tensilely strained crystalline silicon, the layer of partially compressive strain-relaxed silicon-germanium alloy, and the top layer of tensilely strained crystalline silicon define a plurality of holes extending therethrough.

8. The semiconductor structure of claim 1 wherein the multilayer semiconductor structure is not supported by a pedestal comprising silicon oxide upon which is was grown.

9. The semiconductor structure of claim 1, further wherein the multilayered semiconductor structure is not firmly attached to an underlying substrate, in that it can be removed from the surface of such underlying substrate by immersing the multilayered semiconductor structure and the underlying substrate in water.

10. The semiconductor structure of claim 1 further including a substrate on which the bottom silicon layer is supported.

11. The semiconductor structure of claim 10 wherein the substrate is crystalline silicon.

12. The semiconductor structure of claim 1 wherein the silicon-germanium layer is at least 50 nm thick.

13. The semiconductor structure of claim 12 wherein the silicon layer thicknesses are less than about 200 nm.

14. A strained multilayer semiconductor structure comprising:
   (a) a bottom layer of tensilely strained crystalline silicon;
   (b) a first layer of partially compressive strain-relaxed silicon-germanium alloy on the bottom silicon layer, the thickness of the first layer of partially compressive strain-relaxed silicon-germanium alloy being below the thickness at which plastic relaxation generates dislocations in the structure;
   (c) a second layer of tensilely strained crystalline silicon on the first silicon-germanium layer;
   (d) a second layer of partially compressive strain-relaxed silicon-germanium alloy on the second layer of tensilely strained silicon, wherein the Ge content in the second silicon-germanium alloy layer is the same as or higher than that in the first silicon-germanium alloy layer; and
   (e) a layer of tensilely strained crystalline silicon on the second silicon-germanium alloy layer, wherein the strain state of the multilayered semiconductor structure is achieved by elastic strain sharing between the layers and further wherein the multilayer semiconductor structure is completely released from an underlying substrate upon which it was grown.

15. The semiconductor structure of claim 14 wherein the silicon-germanium layers have a germanium content of about 5% to about 35%.

16. The semiconductor structure of claim 14 wherein the germanium content of the second silicon-germanium layer is higher than that of the first silicon-germanium layer.

17. The semiconductor structure of claim 14 wherein the multilayer semiconductor structure is not supported by a pedestal comprising silicon oxide upon which is was grown.

18. The semiconductor structure of claim 14, further wherein the multilayered semiconductor structure is not firmly attached to an underlying substrate, in that it can be removed from the surface of such underlying substrate by immersing the multilayered semiconductor structure and the underlying substrate in water.

19. The semiconductor structure of claim 14 further including a substrate on which the bottom silicon layer is supported.

20. The semiconductor structure of claim 19 wherein the substrate is crystalline silicon.

21. The semiconductor structure of claim 14 wherein the silicon-germanium layers are at least 50 nm thick.

22. The semiconductor structure of claim 21 wherein the silicon layer thicknesses are less than about 200 nm.

* * * * *